(12) United States Patent
Andreasen et al.

(10) Patent No.: US 6,356,450 B1
(45) Date of Patent: Mar. 12, 2002

(54) CIRCUIT BOARD HOLDERS AND ASSEMBLIES

(75) Inventors: Paul E. Andreasen, Lompoc; Richard W. Sevier, Goleta; James J. Keenan, Santa Barbara, all of CA (US)

(73) Assignee: Hendry Mechanical Works, Goleta, CA (US)

( * ) Notice: Subject to any disclaimer, the term of this patent is extended or adjusted under 35 U.S.C. 154(b) by 0 days.

(21) Appl. No.: 09/412,079

(22) Filed: Oct. 4, 1999

(51) Int. Cl.[7] .................................................. H05K 5/00
(52) U.S. Cl. ........................ 361/759; 361/752; 361/802; 361/825; 439/358; 200/303
(58) Field of Search ............................ 361/704, 705, 361/759, 752, 753, 802, 825; 174/35 R; 439/76.1, 354, 358; 335/8; 200/303

(56) References Cited

U.S. PATENT DOCUMENTS

| 4,812,793 A | | 3/1989 | Krasij ............................ 335/8 |
| 5,943,218 A | * | 8/1999 | Liu .............................. 361/801 |
| 5,969,946 A | * | 10/1999 | Lai et al. .................... 361/704 |
| 6,054,648 A | * | 4/2000 | Hikita et al. ............... 174/35 R |
| 6,056,579 A | * | 5/2000 | Richard, III et al. ........ 439/358 |
| 6,074,237 A | * | 6/2000 | Lee ............................. 439/405 |
| 6,171,131 B1 | * | 1/2001 | Lee ............................. 439/358 |
| 6,176,727 B1 | * | 1/2001 | Liu et al. .................... 439/358 |

* cited by examiner

Primary Examiner—Jayprakash N. Gandhi
Assistant Examiner—Tuan Dinh
(74) Attorney, Agent, or Firm—Koppel & Jacobs (57) ABSTRACT

A circuit board holder has or is provided with a face plate and with walls projecting from an inside of that face plate. A pair of opposite ones of such walls are equipped with circuit board retainers. Such retainers may be inside and/or outside of a space in the circuit board holder. The circuit board holder is equipped with one or more holder retainers or resilient snaps for releasably retaining that circuit board holder in an aperture of a panel. Such holder retainers or resilient snaps may have serrations for engaging panels of different thicknesses at their apertures. Such panel may be provided with a slot or slots at that aperture for access to the holder retainer or resilient snaps through the panel. The holder retainer or resilient snap may be released through such slots, such as by screwdrivers or other release tool, for removal of the circuit board holder or similar device from the panel.

4 Claims, 6 Drawing Sheets

CIRCUIT BOARD HOLDERS AND ASSEMBLIES

FIELD OF THE INVENTION

The subject invention relates to circuit board holders and circuit board assemblies.

BACKGROUND

The utility of printed and other circuit boards is well known.

In the field of circuit breakers, the art has evolved progressive methods and circuit breaker housings for conveniently mounting circuit breakers in corresponding apertures of power switching panels, such as apparent from U.S. Pat. No. 4,812,793, by Bohdan Krasij, issued Mar. 14, 1989 for "Circuit Breaker Housing With Centered Actuator." Circuit breaker housings such as shown in FIG. 9 of that patent have been and are being sold as "dummies" for covering up panel apertures where no circuit breaker is being mounted at the time. Commercial versions of such dummies accommodate different mounting panel thicknesses by serrations at ends of so-called wings 220c shown in that patent.

In the circuit board field, there exists a need for improved circuit board holders and assemblies. By way of example and not by way of limitation, the need is particularly pressing in applications requiring rapid circuit board replacements, preferably without power interruption. One example in this respect is the alarm circuit field, such as in telephone exchange and the like, where circuit boards of alarm systems need to be replaced without disruption of power to distribution circuits.

SUMMARY OF THE INVENTION

It is an object of the invention to provide improved methods of making circuit board holders.

It is a germane object of the invention to provide improved circuit board holders.

It is a related object of the invention to provide improved methods of making circuit board assemblies.

It is a related object of the invention to provide improved circuit board assemblies. Other objects will become apparent in the further course of this disclosure.

From a first aspect thereof, the invention resides in a method of making a circuit board holder and, more specifically, resides in the improvement comprising, in combination, providing that circuit board holder with a face plate and with walls projecting from an inside of that face plate, equipping a pair of opposite ones of such walls with circuit board retainers and equipping that circuit board holder with a holder retainer for releasably retaining that circuit board holder in the mentioned aperture of the panel.

From a related aspect thereof, the invention resides in a circuit board holder comprising, in combination, a face plate and walls projecting from an inside of that face plate, circuit board retainers at a pair of opposite ones of such walls, and a holder retainer at an edge of the face plate.

The circuit board retainers may be inside and/or outside of the circuit board holder.

From another aspect thereof, the invention resides in a method of mounting a device, such as a circuit board holder, in an aperture of a panel, comprising, in combination, providing that device with a resilient snap for releasably retaining that device in the panel at that aperture, providing the panel with a slot at that aperture for access to the resilient snap through that panel, and releasing such resilient snap through that slot for removal of the device from the panel.

From a related aspect thereof, the invention resides in a combination of a panel having an aperture, a device, such as a circuit board holder, retained in that aperture by a resilient snap at an edge of that aperture, and a slot in such panel at that aperture exposing the resilient snap through the panel at an edge of the mentioned aperture in that panel.

Embodiments of the invention extend to assemblies of such circuit board holders with circuit boards therein and with circuit panels.

BRIEF DESCRIPTION OF THE DRAWINGS

The subject invention and its various aspects and objects will become more readily apparent from the following detailed description of preferred embodiments thereof, illustrated by way of example in the accompanying drawings which also constitute a written description of the invention, wherein like reference numeral designate like or equivalent parts, and in which.

MODES OF CARRYING OUT THE INVENTION

The drawings illustrate methods of making circuit board holders, improved circuit board holders and assemblies of such circuit board holders with circuit boards therein, pursuant to the subject invention and embodiments thereof.

Methods of making a circuit board holder 10, according to embodiments of the invention for installation in an aperture 12 of a power panel 13, provide that circuit board holder with a face plate 14 larger than that aperture and with walls 16, 17, 18 and 19 projecting from an inside 20 of that face plate. Those embodiments of the invention equip a pair of walls 16 and 18 of opposite ones of the walls 16, 17, 18 and 19 with circuit board retainers 21 and 22 and/or 33 and 34. Those embodiments of the invention further equip the circuit board holder 10 with a holder retainer 23 for releasably retaining that circuit board holder in the mentioned aperture 12 of the panel 13.

Plastics material molding or other well-known manufacturing techniques may be employed for making the circuit board holders herein disclosed.

In apparatus terms, a circuit board holder 10 according to an embodiment of the invention installable in the aperture 12 of panel 13 according to the illustrated embodiments of the invention comprises a face plate 14 larger than that aperture 12 and walls 16, 17, 18 and 19 projecting from the inside 20 of that face plate, circuit board retainers 21 and 22 and/or 33 and 34 at a pair of opposite ones of such walls, such as walls 16 and 18, and a holder retainer 23 at an edge 25 of the face plate. Such holder retainer may be spaced from that face plate by a distance corresponding to a thickness 26 of the panel, such as seen in FIG. 2 showing an assembly of the circuit board holder 10 with a panel 13 and a circuit board 28.

Figure 1:
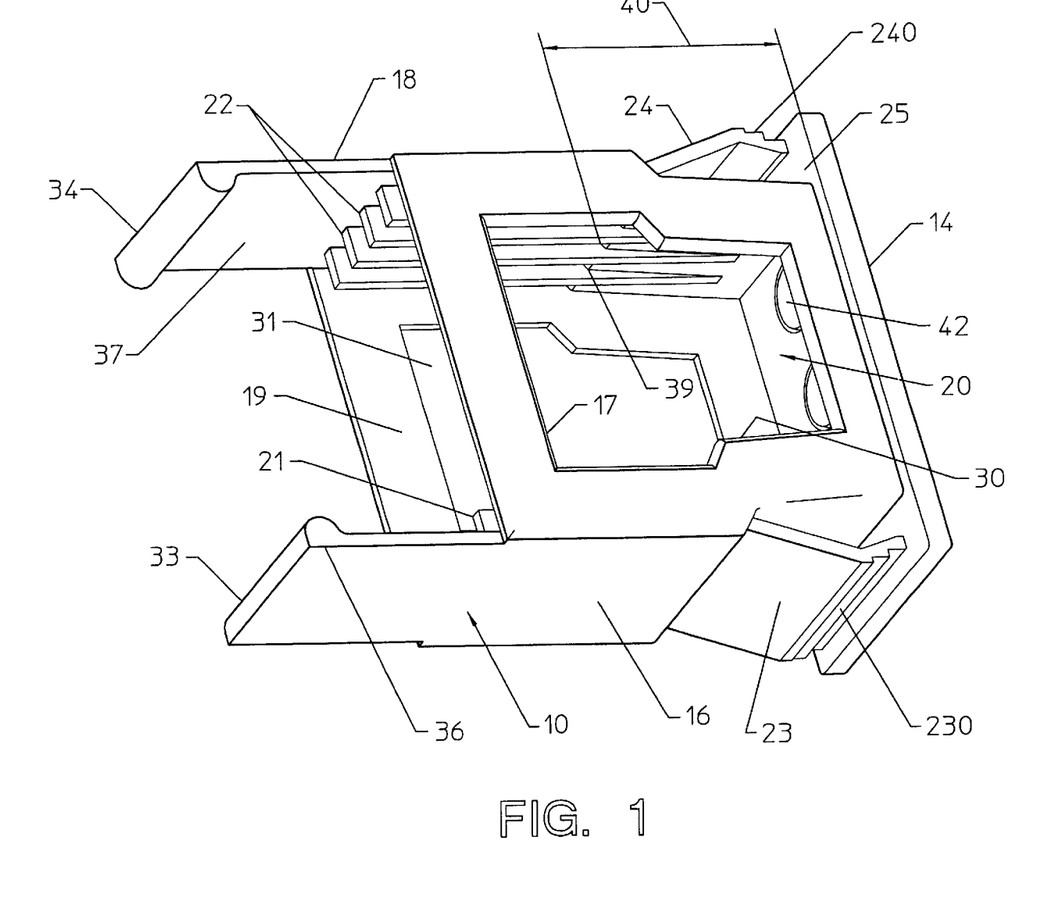
FIG. 1 is a perspective view of a circuit board holder according to an embodiment of the invention.

At least one of another pair of the walls 16 to 19 may be provided with or has a lateral opening covering at least one half of that wall. FIG. 1 by way of example shows both pairs of walls 17 and 18 with such lateral openings 30 and 31 providing, for instance, access to one or more installed circuit boards 28, such as for cooling air and the like, or for other purposes. In that case, the space 20 is still inside the circuit board holder.

Within the scope of the invention, various devices and features may be used as circuit board retainers. By way of example and not by way of limitation, circuit board retainers may be provided internally of the space 20 inside the circuit board holder 10, such as seen at 21 and 22, and may therefor be termed "internal circuit board retainers." Alternatively or preferably additionally, circuit board retainers may be provided externally of the inside space 20, such as seen at 33 and 34, and may therefor be termed "external circuit board retainers."

Figure 2:
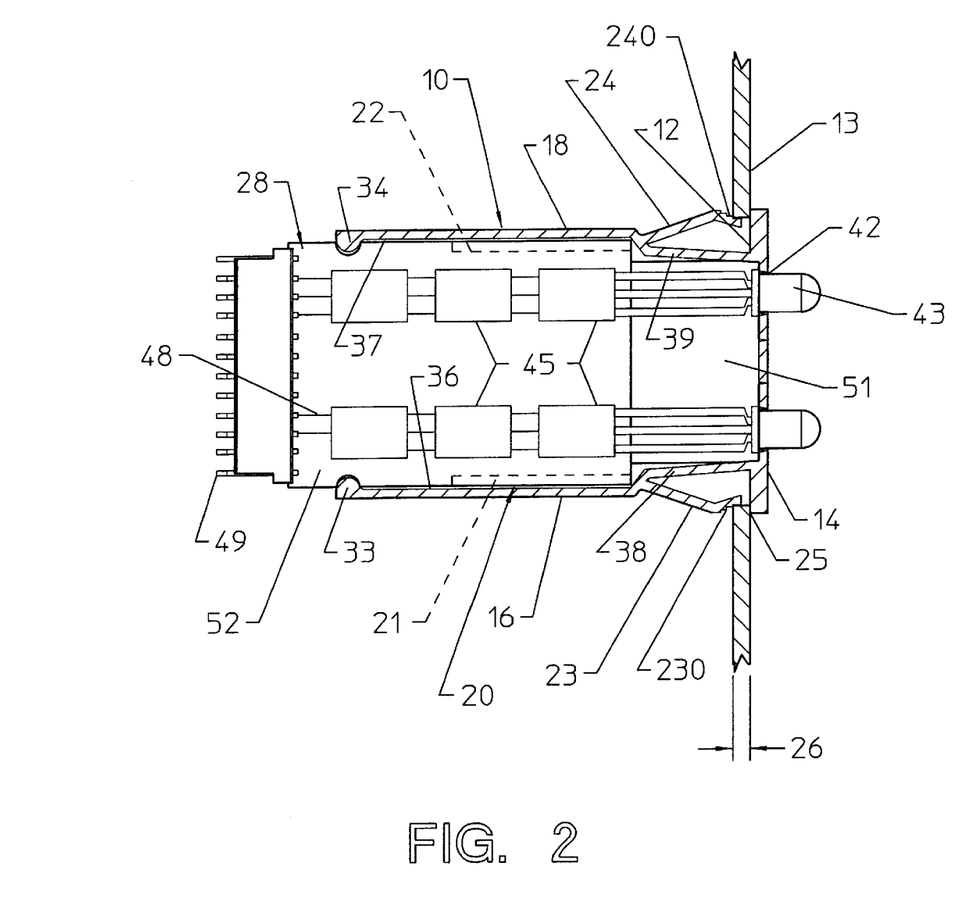
FIG. 2 is a longitudinal section through the circuit board holder according to FIG. 1, with an inserted circuit board according to a further embodiment of the invention, and with such circuit board assembly releasably retained in a corresponding aperture of a panel.
Figure 3:
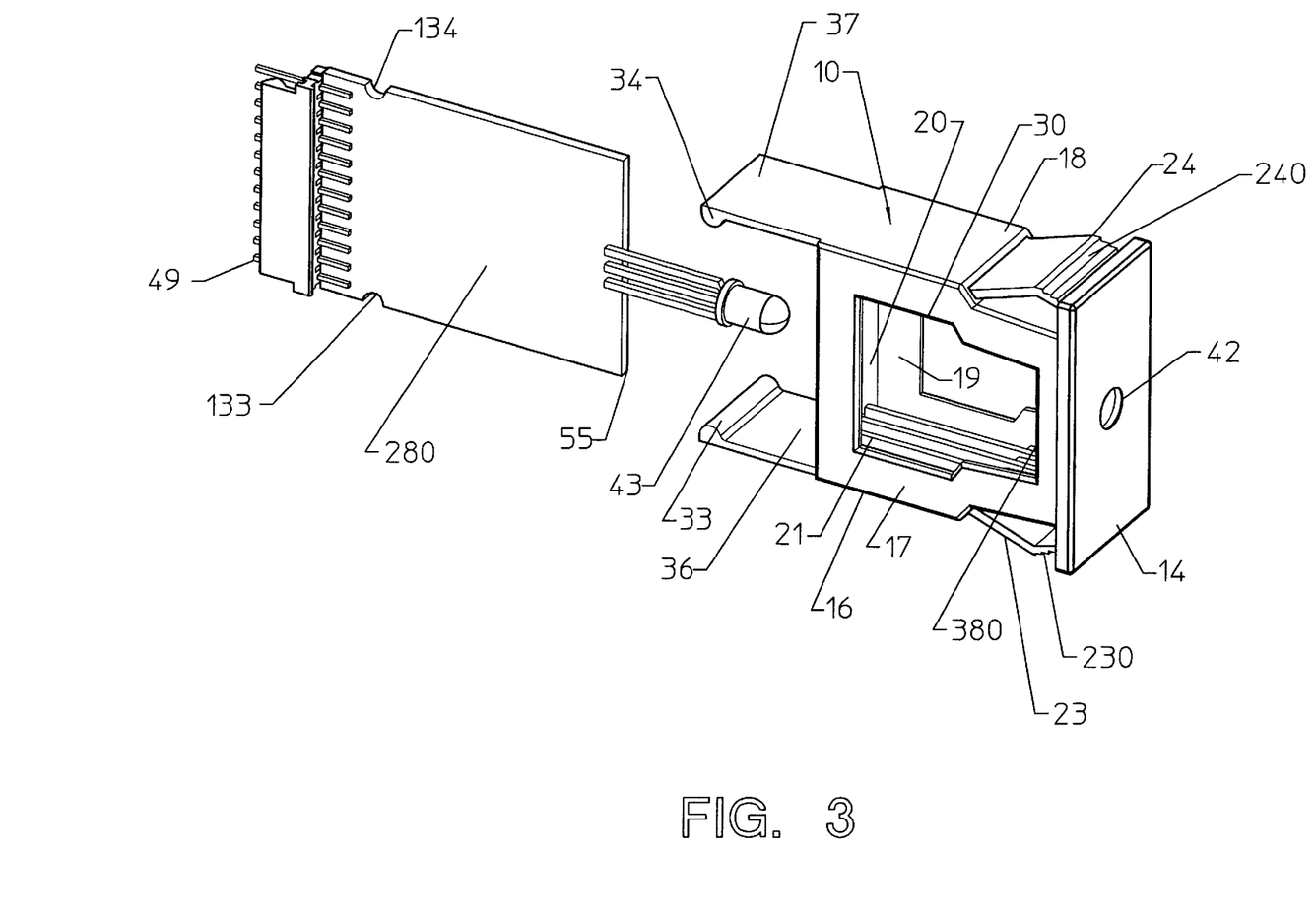
FIG. 3 is an exploded view of a circuit board assembly showing insertion of a circuit board into a circuit board holder according to a related embodiment of the invention.
Figure 4:
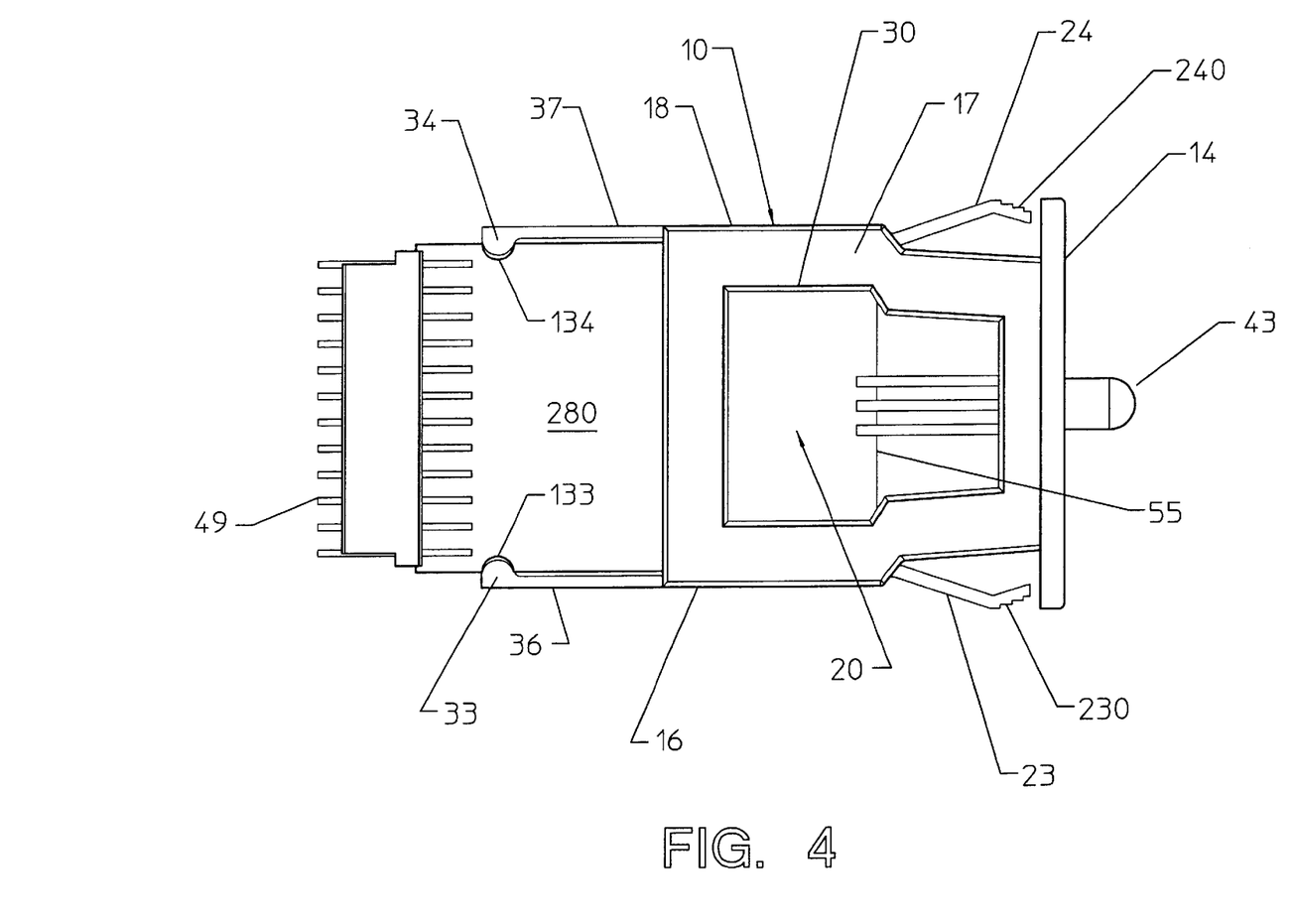
FIG. 4 is a top view of that circuit board assembly.

Accordingly to the embodiments of the invention shown in FIGS. 2 to 4, a circuit board 28 or 280 is inserted into the circuit board holder 10. The inserted circuit board 28 or 280 is substantially retained in a first direction inside of the circuit board holder, such as with internal circuit board retainers 21 and 22, and is substantially retained in a second direction, such as transversely to that first direction, externally of the inside space 20 of the circuit board holder, such as with external circuit board retainers 33 and 34.

The circuit board retainers 21 and 22, according to the illustrated embodiment of the invention, include or are shaped as spaced rails for slideably receiving a circuit board 28 or 280. In this respect, FIGS. 1 and 3 show several such circuit board retainers or spaced rails 21 and 22 in each of the pair of opposite walls 16 and 18, respectively, for slideably receiving at least one circuit board 28 at one of several levels in the circuit board holder. Alternatively, two or more circuit boards may be accommodated in one circuit board holder 10.

According to the illustrated embodiment of the invention, the circuit board holder 10 has or is provided with external circuit board retainers 33 and 34 in addition to the internal circuit board retainers 21 and 22.

Also according to the illustrated embodiment of the invention, the pair of opposite walls 16 and 18 has or is provided with extensions 36 and 37 beyond the inside 20 of the circuit board holder 10. Such extensions 36 and 37 are equipped with circuit board retainers, or such circuit board retainers 33 and 34 are on these extensions 36 and 37, respectively.

By way of example, as illustrated in FIGS. 2 and 4, the circuit board 28 is releasably retained with circuit board retainers inside of the circuit board holder 10 and is stabilized in that circuit board holder.

Notwithstanding such terminology, the external circuit board retainer 33 and 34 may serve as circuit board stabilizers and may serve the purpose of retaining circuit boards 28 and 280 in the circuit board holder, or the retainers 21 and 22 and 33 and 34 may jointly retain and stabilize the circuit board in the circuit board holder.

As seen in FIGS. 1 and 2, the circuit board holder 10 according to an embodiment of the invention has or is equipped with accommodations 38 and 39 at rails 21 and 22, respectively. Such accommodations 38 and 39 may be a narrowing of the holder structure permitting the holder retainers 23 and 24 to be bent inwardly for a release of the circuit board holder 10 from the panel 13.

Alternatively or additionally, the accommodations 38 and 39 may in effect be circuit board stops at a distance 40 from a rear of the face plate 14.

Within the scope of the invention, the circuit board 28 may be provided with a frontal portion 51 of reduced width relative to a subsequent main portion 52 of that circuit board. Such circuit board may be inserted in the circuit board holder 10 by inserting the frontal portion 51 of reduced width in between the spaced external circuit board retainers 33 and 34 and by thereupon forcing apart such spaced circuit board retainers with the main portion 52 of the circuit board and by continuing insertion of the circuit board into the circuit board holder so that the circuit board is releasably retained with the internal circuit board retainers 21 and 22 inside of the circuit board holder and is stabilized in that circuit board holder with the external circuit board retainers and stabilizers 33 and 34.

By way of example, the external circuit board retainers and stabilizers 33 and 34 may be forced apart by flexure of the wall extensions 36 and 37.

In this or any other manner within the scope of the invention, the circuit board holder includes an inserted circuit board 28 or 280 extending across that circuit board holder between the pair of opposite walls 16 and 18 and circuit board retainers 21 and 22. Such inserted circuit board preferably also extends between the circuit board retainers or stabilizers 33 and 34, such as shown in FIGS. 2 and 4.

According to the embodiment of the invention shown in FIGS. 3 and 4, one or more circuit board stops 380, such as at the kind of distance 40 shown in FIG. 1 from a rear of the face plate 14, may be provided in the circuit board holder for stopping insertion of a circuit board 280 at a leading edge or corner 55. Alternatively or additionally, catches 133 and 134 corresponding to the external circuit board retainers 33 and 34, respectively, may be provided in the circuit board, such as seen in FIG. 3, in order to retain an inserted circuit board in a predetermined position, such as shown in FIG. 4.

In apparatus terms, an inserted circuit board 280 has lateral catches 133 and 134 externally of a space 20 inside a circuit board holder which has extensions 36 and 37 of a pair of opposite walls 16 and 18, and circuit board retainers 33 and 34 are on those extensions and lateral catches.

According to the embodiment shown in FIGS. 3 and 4, these catches 133 and 134 are lateral notches in the circuit board 280 into which the external circuit board retainers 33 and 34 come to rest when the circuit board is completely inserted into its holder. However, within the scope of the invention, different forms of retainers and catches than those illustrated in the drawings may be employed at 33/133 and 34/134. For instance, instead of being concave as shown in FIGS. 3 and 4, the catches 133 and 134 may, for instance, be convex, and the external retainers 33 and 34 may be correspondingly concave so as to receive such convex catches.

Within the scope of the invention, the wall extensions 36 and 37 and external circuit board retainers 33 and 34 may be subdivided into external circuit board retaining fingers that may alternate with the internal circuit board retainer rails or shelves 21 and 22.

The above mentioned holder retainer 23 preferably is or is shaped as a resilient snap for releasably retaining the circuit board holder 10 in the aperture 12 of the panel 13. As seen in the drawings, such holder retainer may include or be shaped as a pair of resilient snaps 23 and 24 at the pair of opposite walls 16 and 18 for releasably retaining the circuit board holder in aperture 12 of panel 13.

By way of example and not by way of limitation, such snaps 23 and 24 may be the so-called wings 220c shown in the above mentioned U.S. Pat. No. 4,812,793 for circuit breaker housings.

As seen in FIGS. 1 to 3, there may be one or more apertures 42 in the face plate 14, and a signal lamp 43 may be in any or each of those apertures and may be connected to the circuit board 28, for instance. Such apertures 42 may be of a knock-out type, being covered in the face plate 14 until needed.

By way of example and not by way of limitation, the circuit board 28 is shown with components 45, circuitry 48, and terminals 49, and similar components may, of course, be provided in the circuit board 280.

Figure 5:
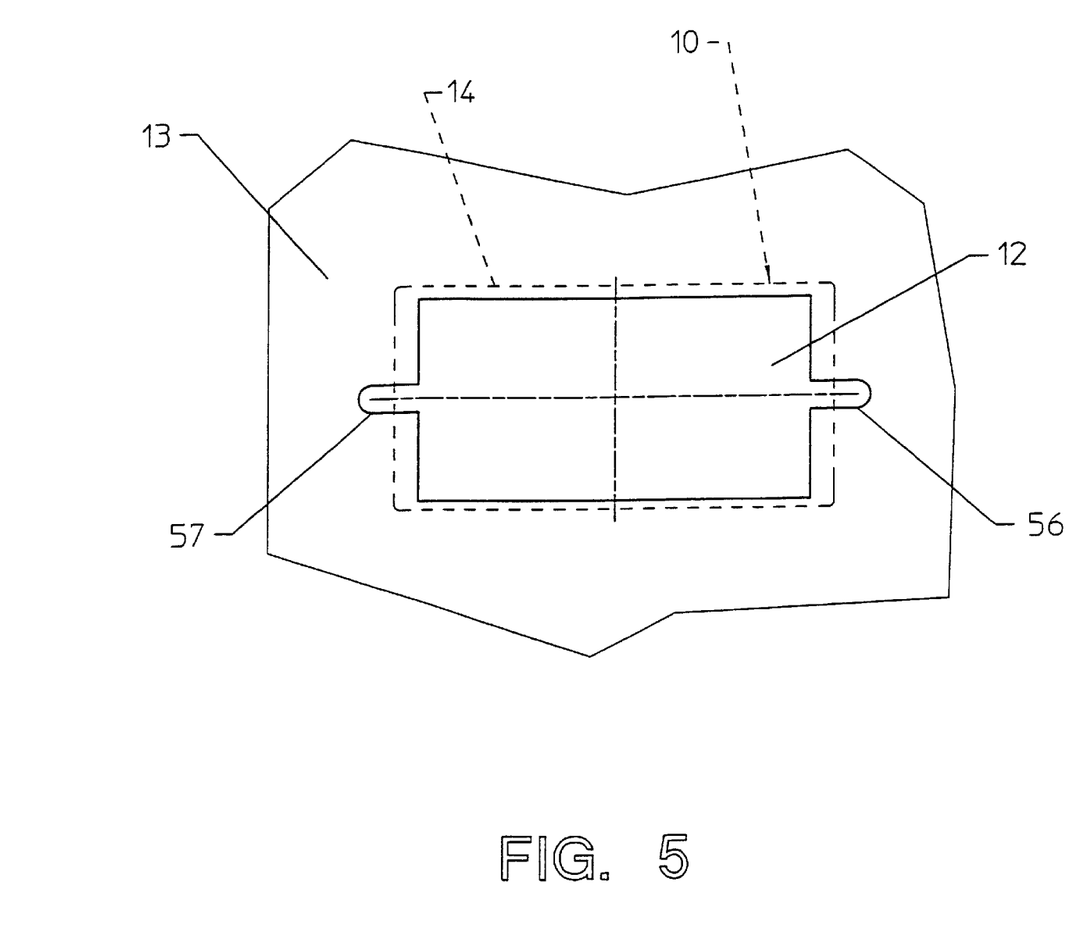
FIG. 5 is a top view of a fraction of a panel for mounting a circuit board holder or similar device according to an embodiment of the invention.
Figure 6:
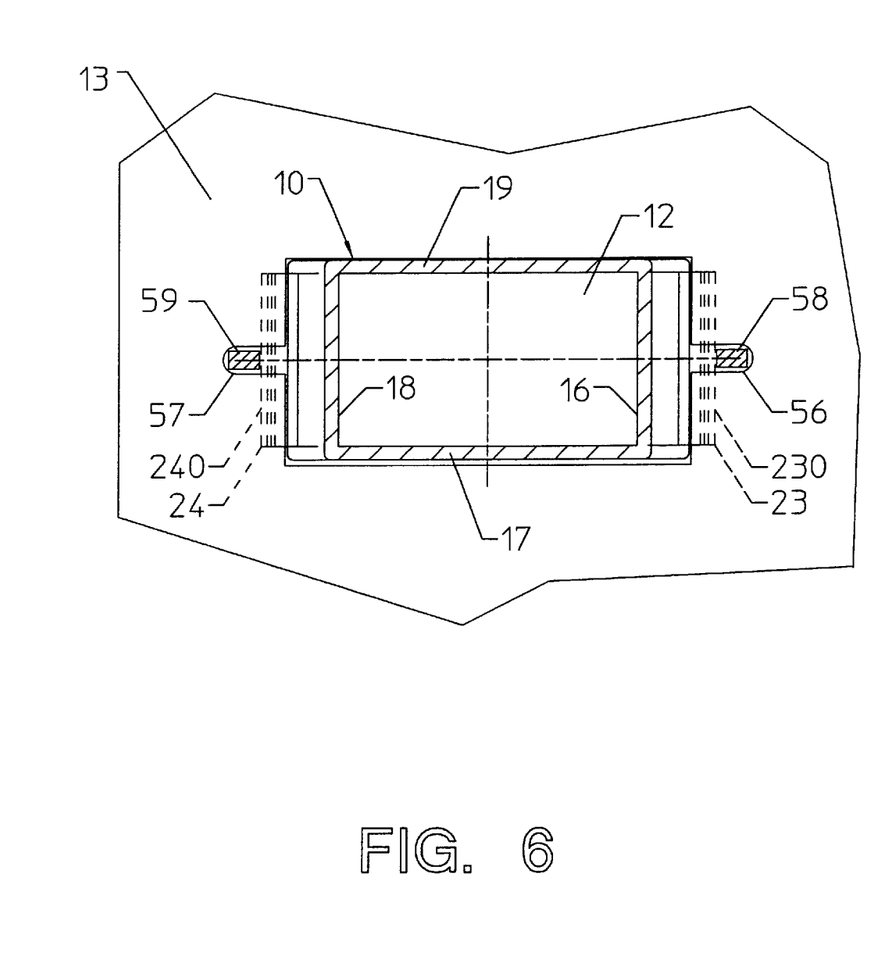
FIG. 6 is a view similar to FIG. 5 with a section through an inserted circuit board holder or similar device and through a release tool pursuant to an embodiment of the invention.

FIGS. 2, 5 and 6 show provision of the panel 13 with an aperture 12 for receiving the circuit board holder 10. According to an embodiment of the invention illustrated in FIGS. 5 and 6, the panel 13 is provided with a slot 56 at the aperture 12 for access to the holder retainer or resilient snap 23 through that panel 13. That embodiment of the invention also effects release of the holder retainer 10 through the slot 56 for removal of the circuit board holder from the panel.

In this respect, FIG. 5 shows the circuit board holder 10 only by a dotted outline of its face plate 14 so as to avoid obstruction of the aperture 12 with lateral slot extensions or slots 56 and 57. Conversely, FIG. 6 shows the circuit board holder 10 in section through its walls 16 to 19 behind its face plate. In FIG. 6, most of the holder retainers or resilient snaps 23 and 24 are covered up by the panel 13 and are therefore shown by dotted lines, except where they cross under the slots 56 and 57.

In apparatus terms, the panel 13 has an aperture 12 adapted to receive the walls 16 to 19 of the circuit board holder 10 behind the face plate 14 seen in FIGS. 1 to 5. A slot 56 in that panel at that aperture exposes the holder retainer or snap 23 through the panel at an edge of that aperture 12 in the panel.

In FIGS. 5 and 6, the components 14, 16 to 19, 23 and 24 if present may signify a device other than a circuit board holder. Accordingly, FIGS. 5 and 6 may be seen as illustrating a method of mounting a device, such as a circuit board holder, in an aperture 12 of a panel 13, comprising, in combination, providing that device with a resilient snap 23 for releasably retaining that device in the panel at that aperture, providing the panel with a slot 56 at that aperture for access to the resilient snap 23 through that panel, and releasing such resilient snap through that slot for removal of the device from the panel 13.

In this respect, FIGS. 5 and 6 also illustrate a combination of a panel 13 having an aperture 12 and a device, such as a circuit board holder 10, retained in that aperture by a resilient snap 23 at an edge of that aperture, and a slot 56 in such panel at that aperture exposing such resilient snap through the panel at an edge of the mentioned aperture in that panel 13.

As seen in FIG. 6, the embodiment of the invention currently under consideration also provides a tool 58 insertable through slot 56. By way of example and not by way of limitation, the tool 58 may be a screwdriver or similar device which has a blade or similar implement having lateral dimensions smaller than the slot 56 so as to be insertable therein and therethrough to the holder retainer or resilient snap 23. In this or any other manner within the scope of the invention, the holder retainer or resilient snap 23 may be released with a tool 56 insertable through slot 56. Such release, may, for instance, be effected by depression of the resilient snap 23 toward the device 10 or its wall 16, until the depressed snap 23 clears the aperture 12 for a removal of the circuit board holder 10 or other device from the panel 13.

According to an embodiment of the invention, the holder retainer 23 is provided with steps or serrations 230 for mounting the circuit board holder 10 in different mounting panels, including the mounting panel 13 of thickness 26 such as shown in FIG. 2 and mounting panels of other thicknesses, such as seen also in FIG. 6.

In principle, and within the scope of the invention, there need only be one holder retainer or resilient snap 23, in which case only one lateral slot 56 and only one release tool 58 is required. However, where there are a pair of resilient snaps 23 and 24 at the pair of opposite walls 16 and 18, such as shown in FIGS. 1 to 4, for releasably retaining a circuit board holder 10 or similar device in the aperture 12 of a panel 13, such as shown in FIGS. 2, 5 and 6, then there need to be a pair of corresponding slots 56 and 57 and a pair of corresponding tools 58 and 59 for a simultaneous release or depression of both resilient snaps 23 and 24, such as seen in FIG. 6 for the desired removal of the device 10 from the panel 13. There also may be panel-accommodating serrations 230 and 240 in each holder retainer or resilient snap 23 and 24, respectively.

Accordingly, pursuant to conventional patent practice, expressions such as "a slot" and "a tool" employed in this description and in accompanying claims implicitly stand for "at least one slot" and "at least one tool," respectively, extending to a provision or utilization of two slots, such as shown at 56 and 57 and two release tools, such as shown at 58 and 59 in FIG. 6, for instance.

This extensive disclosure will render apparent or suggest to those skilled in the art various modifications and variations within the spirit and scope of the invention.

We claim:

1. A circuit board holder, comprising in combination:

a face plate and walls projecting from an inside of said face plate;

circuit board retainers at a pair of opposite ones of said walls; and a holder retainer at an edge of said face plate;

wherein said circuit board retainers include spaced rails on said pair of opposite walls inside of said circuit board holder; and said circuit board holder has circuit board accommodations at said rails at a distance from a rear of said face plate.

2. A circuit board holder, comprising in combination:

a face plate and walls projecting from an inside of said face plate;

circuit board retainers at a pair of opposite ones of said walls; and a holder retainer at an edge of said face plate;

wherein said circuit board retainers include spaced rails on said pair of opposite walls inside of said circuit board holder; and said circuit board holder has circuit board stops at said rails at a distance from a rear of said face plate.

3. A circuit board holder, comprising in combination:

a face plate and walls projecting from an inside of said face plate;

circuit board retainers at a pair of opposite ones of said walls;

a holder retainer at an edge of said face plate;

a panel having an aperture adapted to receive said walls of said circuit board holder behind said face plate; and a slot in said panel at said aperture exposing said holder retainer through said panel at an edge of said aperture in said panel.

4. A combination as in claim 3, including:

a holder retainer release tool having lateral dimensions smaller than said slot.

* * * * *